(12) United States Patent
Shim

(10) Patent No.: US 9,564,247 B2
(45) Date of Patent: Feb. 7, 2017

(54) SMART SELF REPAIR DEVICE AND METHOD

(71) Applicant: SK hynix Inc., Icheon-si, Gyeonggi-do (KR)

(72) Inventor: Young Bo Shim, Dangjin-si (KR)

(73) Assignee: SK HYNIX INC., Icheon-si (KR)

(*) Notice: Subject to any disclaimer, the term of this patent is extended or adjusted under 35 U.S.C. 154(b) by 0 days.

(21) Appl. No.: 14/874,611

(22) Filed: Oct. 5, 2015

(65) Prior Publication Data

US 2016/0351276 A1 Dec. 1, 2016

(30) Foreign Application Priority Data

May 26, 2015 (KR) .................. 10-2015-0072663

(51) Int. Cl.
*G11C 29/00* (2006.01)
*G11C 29/04* (2006.01)
*G11C 17/16* (2006.01)
*G11C 17/18* (2006.01)

(52) U.S. Cl.
CPC .............. *G11C 29/78* (2013.01); *G11C 17/16* (2013.01); *G11C 17/18* (2013.01); *G11C 29/04* (2013.01); *G11C 29/76* (2013.01)

(58) Field of Classification Search
CPC ......... G11C 29/78; G11C 29/76; G11C 29/04; G11C 17/16; G11C 17/18
See application file for complete search history.

(56) References Cited

U.S. PATENT DOCUMENTS

| | | | | |
|---|---|---|---|---|
| 6,324,104 B1* | 11/2001 | Matsui | ................ | G06F 12/0893 |
| | | | | 365/200 |
| 6,421,286 B1 | 7/2002 | Ohtani et al. | | |
| 9,190,175 B2* | 11/2015 | Shim | .................... | G11C 29/787 |
| 9,362,004 B2* | 6/2016 | Shim | .................. | G11C 29/1201 |
| 2007/0076497 A1* | 4/2007 | Chae | ...................... | G11C 29/84 |
| | | | | 365/207 |
| 2010/0254205 A1* | 10/2010 | Yamauchi | .............. | G11C 17/16 |
| | | | | 365/200 |
| 2013/0322149 A1* | 12/2013 | Ryu | ..................... | G11C 7/1045 |
| | | | | 365/96 |
| 2014/0146624 A1 | 5/2014 | Son et al. | | |

* cited by examiner

*Primary Examiner* — Toan Le
(74) *Attorney, Agent, or Firm* — William Park & Associates Ltd.

(57) ABSTRACT

A smart self-repair device includes an ARE array configured to store information on respective bits of a fail address in fuses; a self-repair control block configured to store a row address and a column address corresponding to a fail bit when a fail occurs, analyze a fail mode by comparing the fail address inputted in a test and the stored addresses, and output fail address information and row fuse set information or column fuse set information according to the fail mode; a data control block configured to output repair information to the ARE array according to the fail address information and the row fuse set information or the column fuse set information; and a rupture control block configured to control a rupture operation of the ARE array.

33 Claims, 10 Drawing Sheets

SMART SELF REPAIR DEVICE AND METHOD

CROSS-REFERENCES TO RELATED APPLICATION

The present application claims priority under 35 U.S.C. §119(a) to Korean application number 10-2015-0072663, filed on May 26, 2015, in the Korean Intellectual Property Office, which is incorporated herein by reference in its entirety.

BACKGROUND

1. Technical Field

Various embodiments generally relate to a smart self-repair device and method, and more particularly, to a technology for improving repair efficiency in a package repair operation.

2. Related Art

A DRAM (dynamic random access memory) is constructed by a plurality of memory cells which are arranged in the form of a matrix. If a fail occurs even in one memory cell among a plurality of memory cells, a semiconductor memory device is sorted as a bad product since it cannot perform properly an operation. According to high integration and high speed operation of a semiconductor memory device, the probability of a failed cell to occur increases.

In a conventional package self repair mode, a repair operation is performed by using only a row redundancy, and a column redundancy is not used. Therefore, in the case where a column-oriented fail occurs, it is impossible to repair the fail, and a package yield cannot help but decrease.

Moreover, in order for saturation of package yield, wafer test conditions should be diversified, and a package yield checking process should be repeated a multitude of times. In such a situation, a yield ramp-up time lengthens, and a number of experiment equipments are needed.

SUMMARY

In an embodiment, a smart self-repair device may include: an array rupture electrical fuse (ARE) array configured to store information on respective bits of a fail address in fuses. The smart self-repair device may also include a self-repair control block configured to store a row address and a column address corresponding to a fail bit when a fail occurs; analyze a fail mode by comparing the fail address inputted in a test and the stored addresses; and output fail address information and row fuse set information or column fuse set information according to the fail mode. The smart self-repair device may also include a data control block configured to output repair information to the ARE array according to the fail address information and the row fuse set information or the column fuse set information. The smart self-repair device may also include a rupture control block configured to control a rupture operation of the ARE array.

In an embodiment, a smart self-repair method may include: storing a row address and a column address corresponding to a fail bit in a register. The method may also include analyzing a fail mode by comparing a fail address inputted in a test and the addresses stored in the register. The method may also include searching unused fuse set information according to fuse information applied from an array rupture electrical fuse (ARE) array in a boot-up operation. Further, the method may include receiving fail address information corresponding to the first fail bit and the fuse set information, and performing a row repair operation or a column repair operation corresponding to the fail mode.

In an embodiment, a smart self-repair device comprises a self-repair control block configured to output bank signals, fail row addresses, fail column addresses, fuse set signals, and a fuse set selection signal. The smart self-repair device also includes a data control block configured to receive the bank signals, the fail row addresses, the fail column addresses, the fuse set signals, the fuse set selection signal, memory repair data, and a self-rupture signal and output bank addresses, addresses, and fuse signals. The smart self-repair device also includes an array rupture electrical fuse (ARE) array configured to perform a rupture operation according to the bank addresses, the addresses and the fuse signals.

Where a row redundancy signal is a low level, the fail mode analysis section determines that a fail has occurred in a cell in which a row redundancy is used, and, where the row redundancy signal is a high level, the fail mode analysis section determines that a fail has occurred in a main cell.

The fail mode analysis section receives the outputs of the multi-bit counters, a row redundancy signal, a redundancy control signal, a row redundancy selection signal, a column redundancy selection signal and row/column fuse nonuse signals, and outputs the fuse set selection signal for performing repair using a row redundancy or a column redundancy, to the data control block.

The fail mode analysis section receives the outputs of the multi-bit counters, a row redundancy signal, a redundancy control signal, a row redundancy selection signal, a column redundancy selection signal and row/column fuse nonuse signals, and determines whether it is a single bit fail, a column-oriented fail, a row-oriented fail or a cluster-oriented fail.

The fail mode analysis section comprises: a selection signal generation part configured to perform a logic function on a row multi-bit signal and a column multi-bit signal applied from the multi-bit counters, a priority signal, a row redundancy signal, a row redundancy selection signal and a column redundancy selection signal, and output the fuse set selection signal; and a control signal generation part configured to perform an other logic function on the row multi-bit signal, the column multi-bit signal, a row fuse nonuse signal, a column fuse nonuse signal and a redundancy control signal, and generate the priority signal.

Where both the row multi-bit signal and the column multi-bit signal are high levels, the fail mode analysis section determines that both a row-oriented fail and a column-oriented fail have occurred and outputs the fuse set selection signal at a low level, and, where at least any one of the row multi-bit signal and the column multi-bit signal is the low level, the fail mode analysis section changes the fuse set selection signal.

The row/column address registers receive bank addresses, a row address and a column address of a failed memory cell, a row repair flag signal and a column region identification signal, and sequentially store the row address and the column address in a plurality of registers in correspondence to storage signals.

The multi-bit counters increase count values where comparison results of the address comparison sections are equivalent.

The multi-bit counters change count values which serve as references for a row-oriented fail or a column-oriented fail.

The repair selection unit further comprises: a first selection section configured to select any one of outputs of row/column address registers in correspondence to selection signals; and a second selection section configured to select any one of the outputs of multi-bit counters in correspondence to the selection signals, and output it to a fail mode analysis section.

The first selection section selects any one of the outputs of the row/column address registers, and outputs a row redundancy signal which represents whether a fail bit uses a row redundancy or not, to the fail mode analysis section.

The fuse set selection unit comprises: a fail region search section configured to search a row address fail region and a column address fail region in correspondence to an output of a first selection section; and a row/column fuse set register configured to store information on unused fuse sets, and output the information to a fail mode analysis section and the rupture control block.

The fuse set selection unit further comprises: a counter configured to count a clock, and output counting signals to the fail region search section, a row/column fuse set register, the rupture control block and the ARE array.

A row/column fuse set register receives a row region signal and a column region signal which are applied from the fail region search section, a clock, row fuse set signals and column fuse set signals which are applied from the ARE array, and a fuse set selection signal, outputs a row fuse nonuse signal and a column fuse nonuse signal to a fail mode analysis section, outputs fuse set signals to the data control block, and outputs a fuse nonuse signal to the rupture control block.

In correspondence to outputs of the self-repair control block, the ARE array repairs a row-oriented fail by using a row redundancy, repairs a column-oriented fail by using a column redundancy, and repairs a fail other than the row/column-oriented fail by selecting a row redundancy or a column redundancy in which a fuse set is left.

DETAILED DESCRIPTION

Hereinafter, a smart self-repair device and method will be described below with reference to the accompanying figures through various examples of embodiments. Various embodiments are directed to a technology for analyzing a fail mode and performing a redundancy operation according to the fail mode in a smart self-repair operation, thereby improving repair efficiency. In the embodiments, since repair may be optimally performed by automatically selecting row or column redundancies according to various fail modes occurring in a package, it is possible to contribute to improvement of a package yield and shorten a yield ramp-up time.

In accordance with an embodiment, in order to perform self-repair, if fails occur during a test, row addresses and column addresses for initially inputted different 3 failed bits are respectively stored in corresponding registers.

Thereafter, failed bits which additionally occur are respectively compared with the already stored row addresses and column addresses for the 3 failed bits. If the address of a failed bit is the same as the address stored in a register, the multi-bit counter of the corresponding row address or column address stored in the register is increased. Conversely, if the address of a failed bit is different from the address stored in a register, failed cell information is gathered in such a way as to discard fail information.

Subsequently, when the test is ended, row address multi-bit counters and column address multi-bit counters are analyzed. It is determined that the 3 fails stored in the registers are single bit fails, row-oriented fails, column-oriented fails or cluster-oriented fails. Row-oriented fails are repaired by using row redundancies, column-oriented fails are repaired by using column redundancies. Further, the remaining fails are repaired by selecting row redundancies or column redundancies in which fuse sets are left. Therefore, when self-repair of a package is performed by applying the embodiment, since various fail modes may be repaired, not only a package yield may be improved, but also a yield ramp-up time may be shortened.

Figure 1:
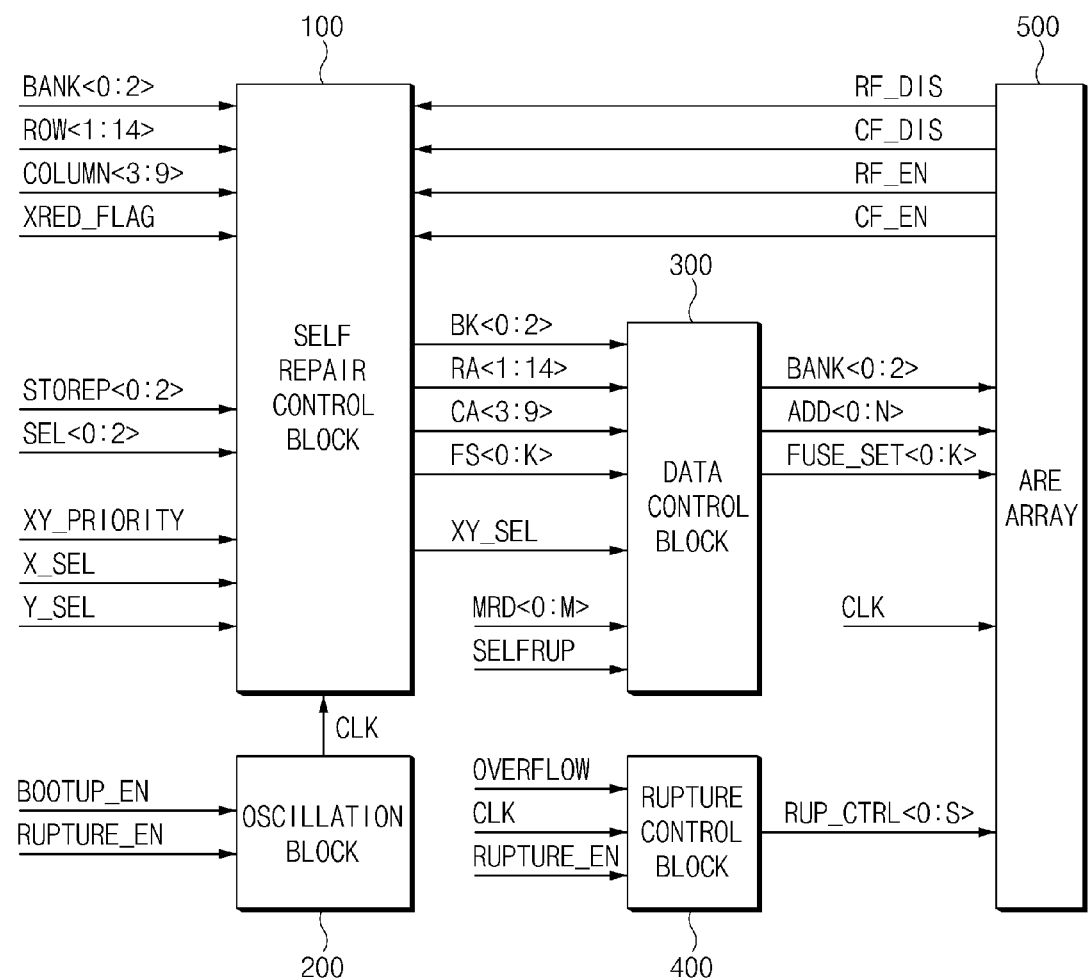
FIG. 1 is a configuration diagram illustrating a representation of an example of a smart self-repair device in accordance with an embodiment.

Referring to FIG. 1, a configuration diagram illustrating a representation of an example of a smart self-repair device in accordance with an embodiment is illustrated.

The smart self-repair device in accordance with an embodiment includes a self-repair control block 100, an oscillation block 200, a data control block 300, a rupture control block 400, and an ARE (array rupture electrical fuse) array 500.

The self-repair control block 100 controls a self-repair operation by receiving bank addresses BANK<0:2>, row addresses ROW<1:14>, column addresses COLUMN<3:9>, a row repair flag signal XRED_FLAG, storage signals STOREP<0:2>, selection signals SEL<0:2>, a redundancy control signal XY_PRIORITY, a row redundancy selection signal X_SEL, a column redundancy selection signal Y_SEL, a clock CLK, row fuse set signals RF_EN and RF_DIS, and column fuse set signals CF_EN and CF_DIS.

The bank addresses BANK<0:2> are bit signals which represent a bank where a failed memory cell is positioned in a function test, among a plurality of banks (for example, 8 banks). The row addresses ROW<1:14> represent the address information of a failed memory cell. The column addresses COLUMN<3:9> represent the address information of the failed memory cell.

The row repair flag signal XRED_FLAG is a signal which represents that a failed memory cell is a row-repaired bit. The storage signals STOREP<0:2> are pulse signals for sequentially storing a corresponding row address and a corresponding column address in each of 3 row/column address registers each time a memory cell fails.

The selection signals SEL<0:2> are signals which are used to optionally select one among the 3 row/column address registers, to perform repair after the function test is ended.

The redundancy control signal XY_PRIORITY is a signal for setting priority between a row redundancy and a column redundancy. For example, if the redundancy control signal XY_PRIORITY is a low level, a row redundancy is used with priority. If the redundancy control signal XY_PRIORITY is a high level, a column redundancy is used with priority. The case where a column redundancy is used with priority may be applied when repairing a single bit fail or a cluster-oriented fail.

The row redundancy selection signal X_SEL is a signal which is used to set a fuse set selection signal XY_SEL to a low level. In other words, the row redundancy selection signal X_SEL is transitioned from a low level to a high level when performing repair using only a row redundancy.

The column redundancy selection signal Y_SEL is a signal which is used to set the fuse set selection signal XY_SEL to a high level. In other words, the column redundancy selection signal Y_SEL is transitioned from a low level to a high level when performing repair using only a column redundancy.

The self-repair control block 100 outputs bank signals BK<0:2>, fail row addresses RA<1:14>, fail column addresses CA<3:9>, fuse set signals FS<0:K> and the fuse set selection signal XY_SEL to the data control block 300.

The bank signals BK<0:2> are the bank information of the fail address stored in the row/column address register selected by the selection signals SEL<0:2> among the 3 row/column address registers.

The fail row addresses RA<1:14> are the fail row address information stored in the row/column address register selected by the selection signals SEL<0:2> among the 3 row/column address registers. The fail column addresses CA<3:9> are the fail column address information stored in the row/column address register selected by the selection signals SEL<0:2> among the 3 row/column address registers.

The fuse set signals FS<0:K> represent the information of the row fuse set or the information of the column fuse set selected by the fuse set selection signal XY_SEL in a row/column fuse set register. The fuse set selection signal XY_SEL is a signal generated in a fail mode analysis section and is used to select a row fuse set or a column fuse set in the row/column fuse set register. For example, a row fuse set may be selected when the fuse set selection signal XY_SEL is the low level. Further, a column fuse set may be selected when the fuse set selection signal XY_SEL is the high level.

The oscillation block 200 generates the clock CLK according to a boot-up enable signal BOOTUP_EN and a rupture enable signal RUPTURE_EN. The oscillation block 200 also outputs the clock CLK to the self-repair control block 100, the rupture control block 400 and the ARE array 500.

The boot-up enable signal BOOTUP_EN is a signal which is used when booting up the ARE array 500. The rupture enable signal RUPTURE_EN is a signal which is used when performing a repair operation. The clock CLK is a signal for driving the counter of the self-repair control block 100 by the output of an oscillator upon boot-up of the ARE array 500.

The data control block 300 controls data by receiving the bank signals BK<0:2>, the fail row addresses RA<1:14>, the fail column addresses CA<3:9>, the fuse set signals FS<0:K>, the fuse set selection signal XY_SEL, memory repair data MRD<0:M> and a self-rupture signal SELFRUP.

The memory repair data MRD<0:M> are externally inputted signals which include fail information such as the information of a bank, a row address, a column address and a fuse set. The self-rupture signal SELFRUP is a signal used when enabling a self-repair mode.

The data control block 300 outputs the bank addresses BANK<0:2>, addresses ADD<0:N> and fuse signals FUSE_SET<0:K> to the ARE array 500. The addresses ADD<0:N> are addresses which include a fuse group position and address bits to cut.

The rupture control block 400 outputs rupture control signals RUP_CTRL<0:S> for controlling the rupture operation of the ARE array 500 in correspondence to a fuse nonuse signal OVERFLOW, the clock CLK and the rupture enable signal RUPTURE_EN.

The fuse nonuse signal OVERFLOW as a combined signal of a row fuse nonuse signal RF_OVERFLOW and a column fuse nonuse signal CF_OVERFLOW is a signal which represents whether or not there is an unused fuse set. For example, if both the row fuse nonuse signal RF_OVERFLOW and the column fuse nonuse signal CF_OVERFLOW are low levels, the fuse nonuse signal OVERFLOW becomes a low level. Conversely, if even any one of the row fuse nonuse signal RF_OVERFLOW and the column fuse nonuse signal CF_OVERFLOW is a high level, the fuse nonuse signal OVERFLOW becomes a high level. The rupture control signals RUP_CTRL<0:S> are signals which control the rupture operation of the ARE array 500 when performing repair.

The ARE array 500 performs the rupture operation for a fuse in correspondence to the bank addresses BANK<0:2>, the addresses ADD<0:N>, the fuse signals FUSE_SET<0:K>, the clock CLK and the rupture control signals RUP_CTRL<0:S>. The ARE array 500 also outputs the row fuse set signals RF_EN and RF_DIS and the column fuse set signals CF_EN and CF_DIS.

The row fuse set signal RF_EN is an enable signal for a row fuse set selected upon scanning of the ARE array 500 in a boot-up process. The row fuse set signal RF_EN is a signal which represents whether a row fuse set is used or not. For example, whether a row redundancy is used or not may be represented in an enable fuse through cut/no cut of the fuse. The row fuse set signal RF_DIS is a disable signal for a row fuse set selected upon scanning of the ARE array 500 in the boot-up process. The row fuse set signal RF_DIS is a signal which represents whether a row fuse set is failed or not. For example, whether a row redundancy is failed or not may be represented in a disable fuse through cut/no cut of the fuse.

The column fuse set signal CF_EN is an enable signal for a column fuse set selected upon scanning of the ARE array 500 in the boot-up process. The column fuse set signal CF_EN is a signal which represents whether a column fuse set is used or not. For example, whether a column redundancy is used or not may be represented in an enable fuse through cut/no cut of the fuse. The column fuse set signal CF_DIS is a disable signal for a column fuse set selected upon scanning of the ARE array 500 in the boot-up process. The column fuse set signal CF_DIS is a signal which represents whether a column fuse set is failed or not. For example, whether a column redundancy is failed or not may be represented in a disable fuse through cut/no cut of the fuse.

As the size of each of elements which construct a semiconductor integrated circuit device becomes smaller and the number of elements included in one semiconductor chip becomes huge, the level of fail density increases. Such increase in fail density serves as a factor that directly decreases the yield of a semiconductor device. In the case where fail density increases severely, a wafer on which semiconductor devices are formed should be discarded.

In order to decrease such fail density, a redundancy circuit for replacing a failed cell with a redundancy cell has been suggested in the art. In the case of a semiconductor memory device, a redundancy circuit (or a fuse circuit) may be disposed for each of a row-related line (for example, a word line) and a column-related line (for example, a bit line).

The redundancy circuit includes the ARE array 500 which stores the address information of a failed cell. The ARE array 500 is constructed by a plurality of fuse sets each including a plurality of fuse lines. The ARE array 500 is a memory which stores information on the respective bits of all fail addresses. The ARE array 500 selects a corresponding row line according to an address as fuse selection information.

In each fuse set, information is programmed in such a way as to fuse a fuse by overcurrent. Self-repair is performed for the purpose of repairing a bit fail in the packaged state of a memory.

The ARE array 500 permanently stores fail information by rupturing electrical fuses corresponding to respective bits. The ARE array 500 controls the rupture operation in correspondence to the rupture control signals RUP_CTRL<0:S> applied from the rupture control block 400.

The ARE array 500 stores the address information of a failed cell according to the rupture operation when the rupture control signals RUP_CTRL<0:S> are enabled. Conversely, the ARE array 500 does not perform the rupture operation when the rupture control signals RUP_CTRL<0:S> are disabled. Each fuse set may be constructed by electrical fuses which program information to fuse fuses by overcurrent.

Figure 2:
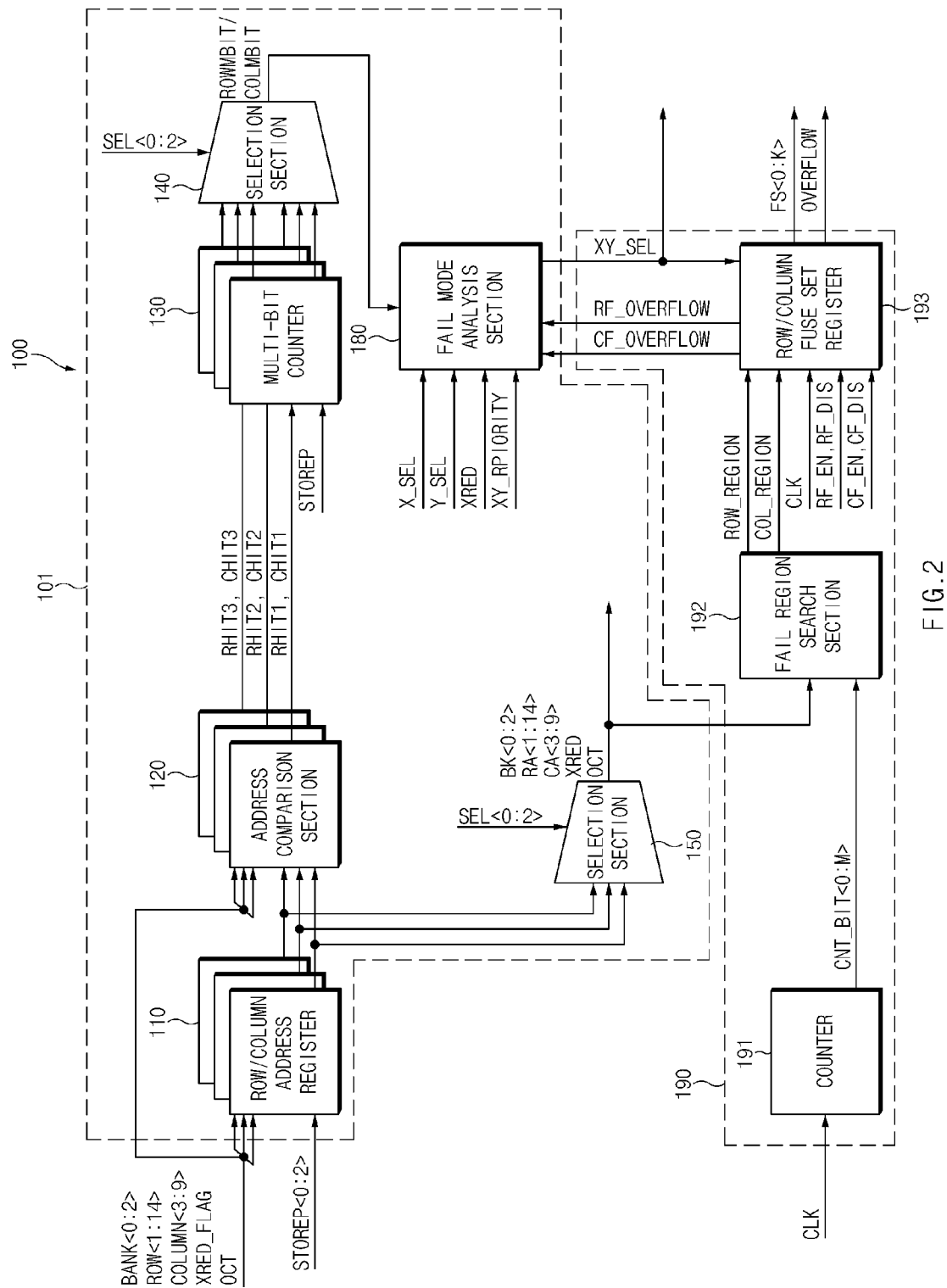
FIG. 2 is a detailed configuration diagram illustrating a representation of an example of the self-repair control block shown in FIG. 1.

Referring to FIG. 2, a detailed configuration diagram illustrating a representation of an example of the self-repair control block 100 shown in FIG. 1 is illustrated.

The self-repair control block 100 includes a repair selection unit 101 and a fuse set selection unit 190. When a fail occurs, the repair selection unit 101 stores a row address and a column address corresponding to a failed bit. The repair selection unit 101 also analyzes a fail mode by comparing a fail address inputted during a test mode with the already stored addresses. The fuse set selection unit 190 outputs fail address information and row fuse set information or column fuse set information in correspondence to a fail mode.

The repair selection unit 101 includes row/column address registers 110, address comparison sections 120, multi-bit counters 130, selection sections 140 and 150, and a fail mode analysis section 180. The fuse set selection unit 190 includes a counter 191, a fail region search section 192, and a row/column fuse set register 193.

When fails occur during a test, the row/column address registers 110 store the row/column addresses of random bits in order in which the fails occur. When fail bits additionally occur, each fail bit is compared with the row addresses or the column addresses of the previously stored fail bits. Further, if the fail bit is not the same as even any one of the row addresses and the column addresses, the fail bit is not stored in the row/column address registers 110.

The row/column address registers 110 receive the bank addresses BANK<0:2>, the row addresses ROW<1:14>, the column addresses COLUMN<3:9>, the row repair flag signal XRED_FLAG, a column region identification signal OCT, and the storage signals STOREP<0:2>.

The address comparison sections 120 compare all fail bits which occur during the test, with the row addresses and column addresses of the fail bits already stored in the row/column address registers 110.

The address comparison sections 120 compare the bank addresses BANK<0:2>, the row addresses ROW<1:14>, the column addresses COLUMN<3:9>, the row repair flag signal XRED_FLAG and the column region identification signal OCT, with the outputs of the row/column address registers 110 and output comparison signals RHIT3, CHIT3, RHIT2, CHIT2, RHIT1 and CHIT1.

The comparison signals RHIT1, RHIT2 and RHIT3 are signals generated where the fail row addresses currently occurred in the function test are the same as the 3 row addresses already stored in the row/column address registers 110 when they are compared with each other. The comparison signal RHIT1 represents a result of comparing the row address stored in the first row/column address register 110. The comparison signal RHIT2 represents a result of comparing the row address stored in the second row/column address register 110. The comparison signal RHIT3 represents a result of comparing the row address stored in the third row/column address register 110.

The comparison signals CHIT1, CHIT2 and CHIT3 are signals generated where the fail column addresses currently occurred in the function test are the same as the 3 column addresses already stored in the row/column address registers 110 when they are compared with each other. The comparison signal CHIT1 represents a result of comparing the column address stored in the first row/column address register 110. The comparison signal CHIT2 represents a result of comparing the column address stored in the second row/column address register 110. The comparison signal CHIT3 represents a result of comparing the column address stored in the third row/column address register 110.

The multi-bit counters 130 increase a corresponding multi-bit count value 1 by 1 each time there where row addresses or column addresses are the same, during the comparison process of the address comparison sections 120. The multi-bit counters 130 count the comparison signals RHIT3, CHIT3, RHIT2, CHIT2, RHIT1 and CHIT1 in correspondence to a storage signal STOREP. The multi-bit counters 130 also output counted values to the selection section 140. The storage signal STOREP is a pulse signal used to increase the values of the 3 multi-bit counters 130 in combination with the comparison signals RHIT1, RHIT2, RHIT3, CHIT1, CHIT2 and CHIT3.

The multi-bit counters 130 may be changed in a count value serving as a reference for determining a row-oriented fail or a column-oriented fail. In other words, if a row fail count reaches a reference value, a row multi-bit signal ROWMBIT becomes high and represents a row-oriented fail. Further, if a column fail count reaches a reference value, a column multi-bit signal COLMBIT becomes high and represents a column-oriented fail.

The selection section 140 outputs the row multi-bit signal ROWMBIT and the column multi-bit signal COLMBIT by selecting the outputs of the multi-bit counters 130 in correspondence to the selection signals SEL<0:2>.

The row multi-bit signal ROWMBIT is the output of the multi-bit counter 130 optionally selected by the selection signals SEL<0:2> among the 3 multi-bit counters 130. The column multi-bit signal COLMBIT is the output of the multi-bit counter 130 optionally selected by the selection signals SEL<0:2> among the 3 multi-bit counters 130.

The selection section 150 outputs the bank signals BK<0:2>, the fail row addresses RA<1:14>, the fail column addresses CA<3:9>, a row redundancy signal XRED and the column region identification signal OCT, by selecting the outputs of the row/column address registers 110 in correspondence to the selection signals SEL<0:2>. The selection section 150 selects one row/column address register 110 among the 3 row/column address registers 110 in correspondence to the selection signals SEL<0:2>.

The row redundancy signal XRED is a signal which represents whether the fail bit stored in the row/column address register 110 by the selection signals SEL<0:2> among the 3 row/column address registers 110 uses a row redundancy or not. For example, if the row redundancy signal XRED is a low level, it represents that a fail has occurred in a cell in which a row redundancy is used. If the row redundancy signal XRED is a high level, it represents that a fail has occurred in a main cell.

The counter 191 counts the clock CLK. The counter 191 outputs count signals CNT_BIT<0:M> to the fail region search section 192.

The fail region search section 192 searches a row address fail region and a column address fail region in correspondence to the output of the selection section 150 when one row/column address register 110 is selected by the selection section 150 and the ARE array 500 is booted up. The fail region search section 192 receives the bank signals BK<0:2>, the fail row addresses RA<1:14>, the fail column addresses CA<3:9>, the row redundancy signal XRED, the column region identification signal OCT and the count signals CNT_BIT<0:M>. The fail region search section 192 also outputs a row region signal ROW_REGION and a column region signal COL_REGION which include the information of a corresponding region.

The row region signal ROW_REGION is generated as the bank signals BK<0:2>, the fail row addresses RA<1:14>, the fail column addresses CA<3:9> and the count signals CNT_BIT<0:M> are combined in the fail region search section 192. The row region signal ROW_REGION also represents the row address region of a failed cell.

The column region signal COL_REGION is generated as the bank signals BK<0:2>, the fail row addresses RA<1:14>, the fail column addresses CA<3:9> and the count signals CNT_BIT<0:M> are combined in the fail region search section 192. The column region signal COL_REGION also represents the column address region of a failed cell.

If the test is ended, one optional row/column address register 110 is selected by the selection signals SEL<0:2> among the row/column address registers 110 in which fail bits are stored. Then, the fail mode analysis section 180 analyzes the fail mode of the fail bit stored in the selected row/column address register 110 in correspondence to the output of the selection section 140. The fail modes of a fail bit may include a single bit fail, a row-oriented fail, a column-oriented fail, a cluster-oriented fail, and so forth.

The fail mode analysis section 180 receives the row multi-bit signal ROWMBIT, the column multi-bit signal COLMBIT, the row redundancy signal XRED, the redundancy control signal XY_PRIORITY, the row redundancy selection signal X_SEL, the column redundancy selection signal Y_SEL, the row fuse nonuse signal RF_OVERFLOW and the column fuse nonuse signal CF_OVERFLOW. The fail mode analysis section 180 outputs the fuse set selection signal XY_SEL to conform to the analyzed fail mode. The fuse set selection signal XY_SEL is a signal which selects a fuse set and an address to perform repair by selecting one of a row redundancy and a column redundancy.

The row fuse nonuse signal RF_OVERFLOW is a signal which represents whether there is an unused row fuse set in a corresponding row address fail region. For example, if the row fuse nonuse signal RF_OVERFLOW is the high level, it represents that there is an unused row fuse set. Further, if the row fuse nonuse signal RF_OVERFLOW is the low level, it represents that there is no unused row fuse set.

The column fuse nonuse signal CF_OVERFLOW is a signal which represents whether there is an unused column fuse set in a corresponding column address fail region. For example, if the column fuse nonuse signal CF_OVERFLOW is the high level, it represents that there is an unused column fuse set. Moreover, if the column fuse nonuse signal CF_OVERFLOW is the low level, it represents that there is no unused column fuse set.

The fail mode analysis section 180 analyzes a fail mode according to the logic levels of the row multi-bit signal ROWMBIT and the column multi-bit signal COLMBIT. For example, if both the row multi-bit signal ROWMBIT and the column multi-bit signal COLMBIT are low, analysis is made to a single bit fail. If the row multi-bit signal ROWMBIT is low and the column multi-bit signal COLMBIT is high, analysis is made to a column-oriented fail. If the row multi-bit signal ROWMBIT is high and the column multi-bit signal COLMBIT is low, analysis is made to a row-oriented fail. If both the row multi-bit signal ROWMBIT and the column multi-bit signal COLMBIT are high, analysis is made to a cluster-oriented fail or a row or column-oriented fail.

The row/column fuse set register 193 searches, stores and outputs information on an unused row redundancy fuse set and an unused column redundancy fuse set. In addition, the row/column fuse set register 193 outputs information on whether there is an unused fuse set.

The row/column fuse set register 193 receives the row region signal ROW_REGION, the column region signal COL_REGION, the clock CLK, the row fuse set signals RF_EN and RF_DIS, the column fuse set signals CF_EN and CF_DIS, and the fuse set selection signal XY_SEL. The row/column fuse set register 193 outputs the row fuse nonuse signal RF_OVERFLOW, the column fuse nonuse signal CF_OVERFLOW, the fuse set signals FS<0:K>, and the fuse nonuse signal OVERFLOW.

Figure 3:
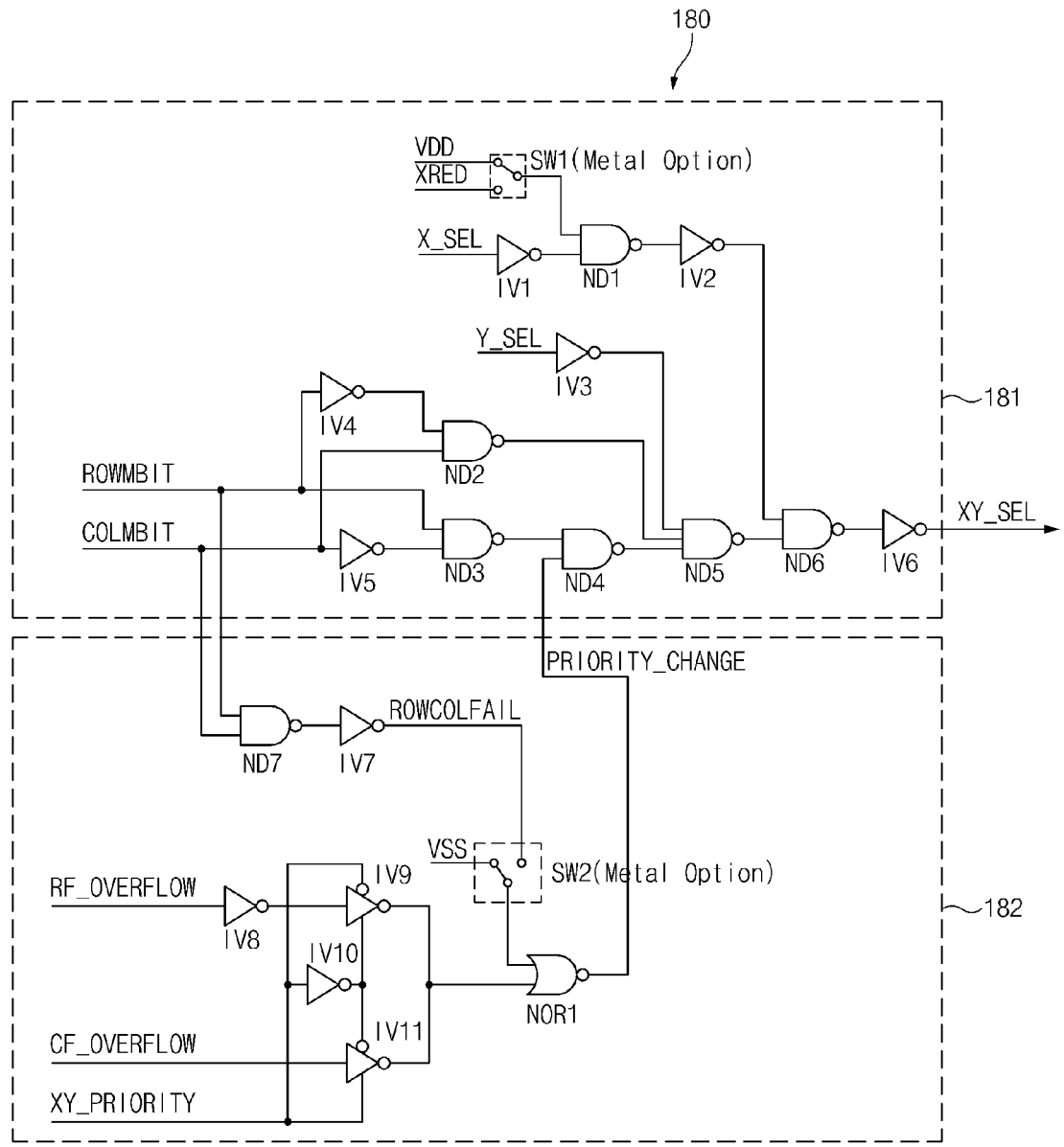
FIG. 3 is a detailed circuit diagram illustrating a representation of an example of the fail mode analysis section shown in FIG. 2.

Referring to FIG. 3, a detailed circuit diagram illustrating a representation of an example of the fail mode analysis section 180 shown in FIG. 2 is illustrated.

The fail mode analysis section 180 includes a selection signal generation part 181 and a control signal generation part 182.

The selection signal generation part 181 includes a plurality of NAND gates ND1 to ND6, a plurality of inverters IV1 to IV6, and a switch SW1. The NAND gate ND1 NANDs or performs a NAND logic function on the inverted signal of the row redundancy selection signal X_SEL, which is generated by the inverter IV1, and the row redundancy signal XRED. The switch SW1 includes a metal option. The switch SW1 also selects and outputs any one of a power supply voltage VDD and the row redundancy signal XRED, to the NAND gate ND1. The NAND gate ND2 NANDs or performs a NAND logic function on the inverted signal of the row multi-bit signal ROWMBIT, which is generated by the inverter IV4, and the column multi-bit signal COLMBIT.

The NAND gate ND3 NANDs or performs a NAND logic function on the row multi-bit signal ROWMBIT and the inverted signal of the column multi-bit signal COLMBIT, which is generated by the inverter IV5. The NAND gate ND4 NANDs or performs a NAND logic function on the output of the NAND gate ND3 and a priority signal PRIORITY_CHANGE. The NAND gate ND5 NANDs or performs a NAND logic function on the inverted signal of the column redundancy selection signal Y_SEL, which is generated by the inverter IV3, the output of the NAND gate ND2, and the output of the NAND gate ND4. The NAND gate ND6 NANDs or performs a NAND logic function on the output of the inverter IV2 and the output of the NAND gate ND5. The inverter IV6 inverts the output of the NAND gate ND6. The inverter IV6 also outputs the fuse set selection signal XY_SEL.

The control signal generation part 182 includes a NAND gate ND7, a plurality of inverters IV7 to IV11, a switch SW2, and a NOR gate NOR1.

The NAND gate ND7 NANDs or performs a NAND logic function on the row multi-bit signal ROWMBIT and the column multi-bit signal COLMBIT. The inverter IV7 inverts the output of the NAND gate ND7. The inverter IV7 also outputs a fail signal ROWCOLFAIL. The switch SW2 includes a metal option. The switch SW2 electrically couples the input terminal of the NOR gate NOR1 to the terminal of a ground voltage VSS or to the application terminal of the fail signal ROWCOLFAIL.

The inverters IV8 and IV9 delay the row fuse nonuse signal RF_OVERFLOW in a non-inverting manner, and outputs a resultant signal to the NOR gate NOR1. The inverter IV10 inverts the redundancy control signal XY_PRIORITY. The inverter IV11 inverts the column fuse nonuse signal CF_OVERFLOW. The inverter IV11 also outputs a resultant signal to the NOR gate NOR1. The NOR gate NOR1 NORs or performs a NOR logic function on the output of the switch SW2 and the output of the inverters IV9 and IV11, and outputs the priority signal PRIORITY_CHANGE.

The fail mode analysis section 180 configured as mentioned above makes a determination as a single bit fail, a cluster bit fail or a row/column cruciform fail, when the fail signal ROWCOLFAIL is a low level. According to this fact, the fuse set selection signal XY_SEL is changed by the column fuse nonuse signal CF_OVERFLOW. Where the fail signal ROWCOLFAIL is a high level, the fail mode analysis section 180 determines that a row-oriented fail and a column-oriented fail have occurred simultaneously, and retains the fuse set selection signal XY_SEL at the low level.

Where the fuse set selection signal XY_SEL is the low level, a row fuse set is selected. Further, in the case where the fuse set selection signal XY_SEL is the high level, a column fuse set is selected.

Table 1 is a table for the fail mode analysis section 180 to define fail modes in correspondence to the logic levels of the priority signal PRIORITY_CHANGE, the row multi-bit signal ROWMBIT, the column multi-bit signal COLMBIT and the fuse set selection signal XY_SEL.

TABLE 1

| PRIORITY_CHANGE | ROWMBIT | COLMBIT | XY_SEL | Fail mode |
|---|---|---|---|---|
| 0 | 0 | 0 | 0 | Row (single bit) |
| 0 | 0 | 1 | 1 | Column-oriented |
| 0 | 1 | 0 | 0 | Row-oriented |
| 0 | 1 | 1 | 0 | Row (cluster) |
| 1 | 0 | 0 | 1 | Column (single bit) |
| 1 | 0 | 1 | 1 | Column-oriented |
| 1 | 1 | 0 | 0 | Row-oriented |
| 1 | 1 | 1 | 1 | Column (cluster) |

As shown in Table 1, the fail mode analysis section 180 controls the logic level of the fuse set selection signal XY_SEL according to a fail mode by combining the logic levels of the priority signal PRIORITY_CHANGE, the row multi-bit signal ROWMBIT and the column multi-bit signal COLMBIT.

Below, descriptions will be made for a process of capturing a fail bit when a fail occurs in a function test, a process of analyzing a fail mode, and a process of selecting a fuse set appropriate for a fail mode. While a plurality of fail bits may be captured and repaired, capture and repair processes for 3 bits will be described as an example in an embodiment.

Figure 4:
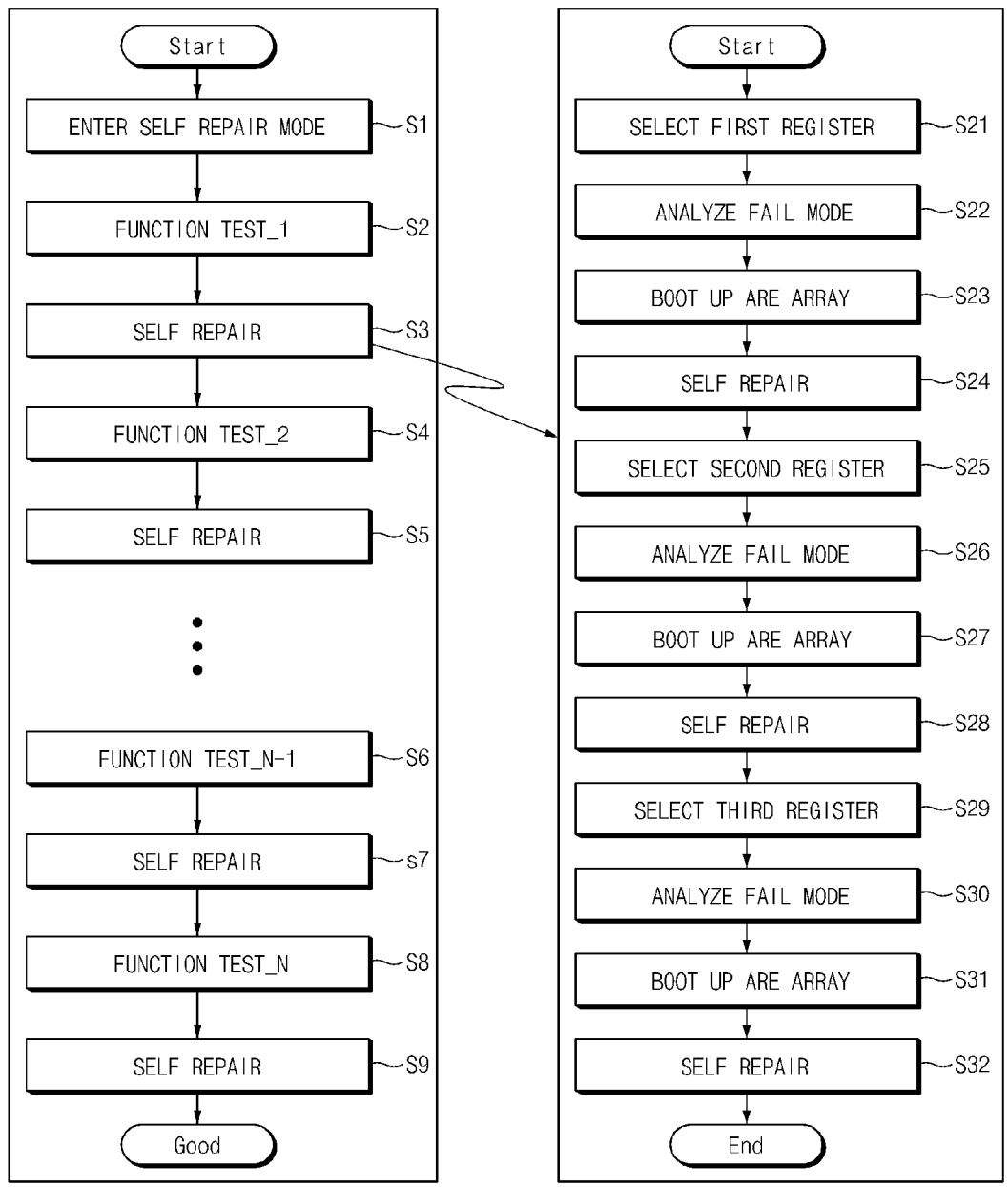
FIGS. 4 to 6 are representations of examples of flow charts to assist in the explanation of operations of the smart self-repair device in accordance with an embodiment.

Referring to FIG. 4, a representation of an example of a flow chart to assist in the explanation of operations of the smart self-repair device in accordance with an embodiment is described.

After entering a self-repair mode to capture a fail bit (step S1), a first function test is performed (step S2). If a fail occurs, a self-repair operation is performed (step S3).

The self-repair operation at the step S3 will be described below in detail. If a first fail occurs, the first row/column address register 110 is selected (step S21), and a fail region is searched and a fail mode is analyzed (step S22). The ARE array 500 is booted up and a corresponding fuse set is selected (step S23). Then, as corresponding fuses are selected one by one in the ARE array 500, the self-repair operation is performed (step S24).

If a second fail occurs, the second row/column address register 110 is selected (step S25). Further, a fail region is searched and a fail mode is analyzed (step S26). The ARE array 500 is booted up and a corresponding fuse set is selected (step S27). Then, as corresponding fuses are selected one by one in the ARE array 500, the self-repair operation is performed (step S28).

If a third fail occurs, the third row/column address register 110 is selected (step S29). In addition, a fail region is searched and a fail mode is analyzed (step S30). The ARE array 500 is booted up and a corresponding fuse set is selected (step S31). Then, as corresponding fuses are selected one by one in the ARE array 500, the self-repair operation is performed (step S32).

Next, a second function test is performed (step S4), and the self-repair operation including the process of the steps S21 through S32 is performed (step S5). Afterwards, an $(N-1)^{th}$ function test is performed (step S6). Further, the self-repair operation including the process of the steps S21 through S32 is performed (step S7). Then, an $N^{th}$ function test is performed (step S8), and the self-repair operation including the process of the steps S21 through S32 is performed (step S9).

Figure 5:
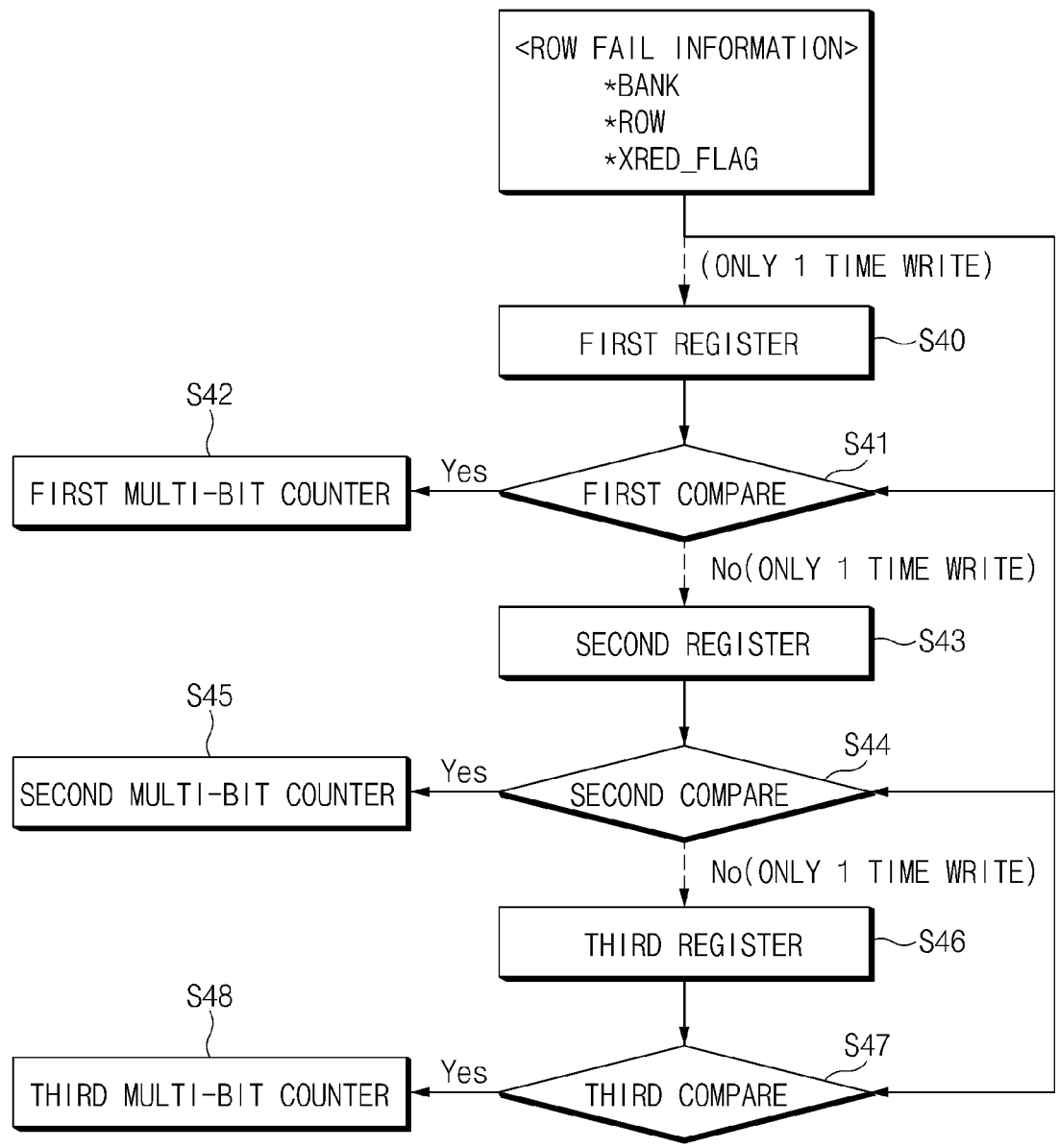
Figure 6:
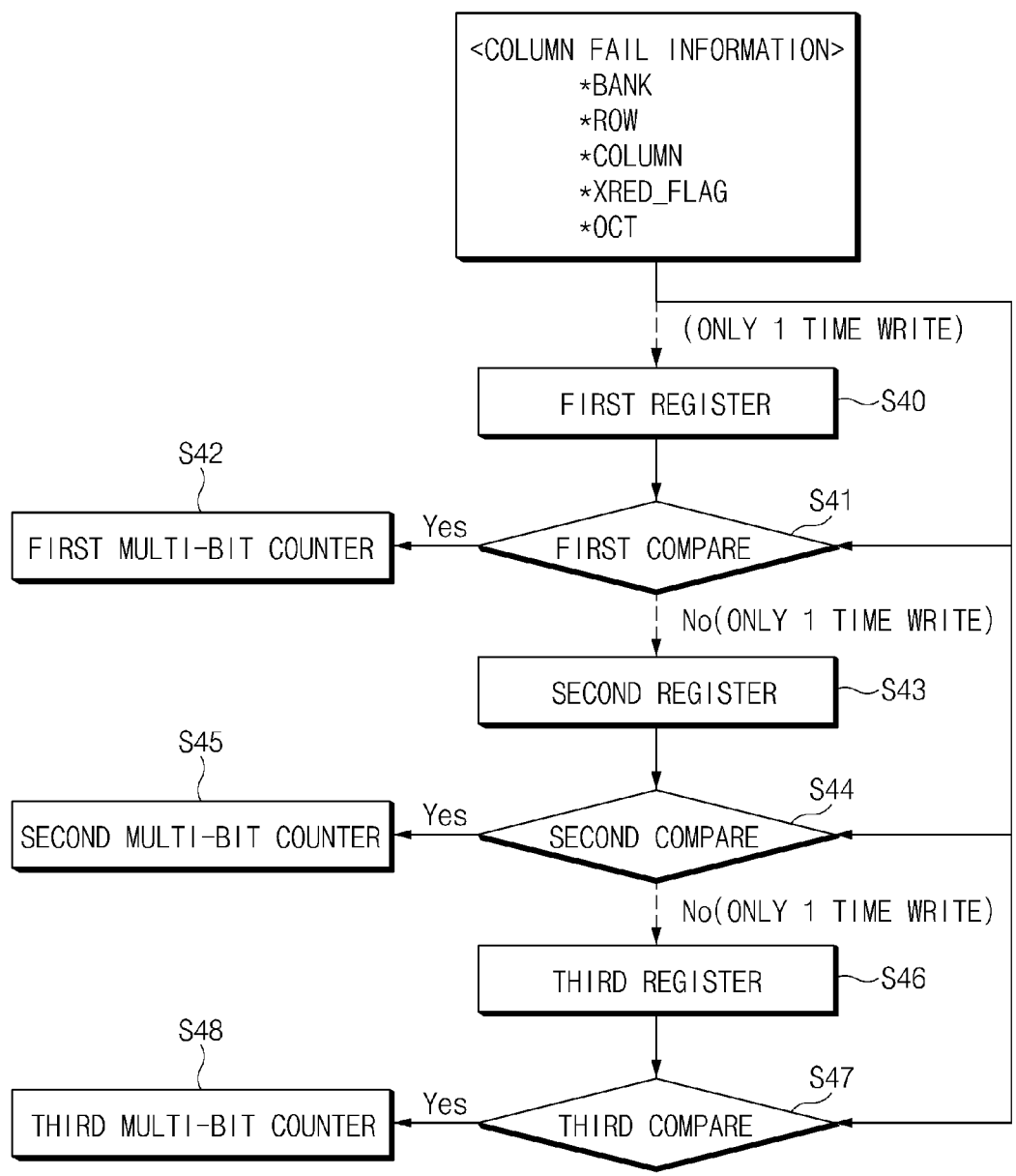

Referring to FIGS. 5 and 6, representations of examples of flow charts to assist in the explanation of a fail address capture operation in the smart self-repair device in accordance with an embodiment are described.

In a row fail as in FIG. 5, the bank addresses BANK<0:2>, the row addresses ROW<1:14> and the row repair flag signal XRED_FLAG are used. In a column fail as in FIG. 6, the bank addresses BANK<0:2>, the row addresses ROW<1:14>, the column addresses COLUMN<3:9>, the row repair flag signal XRED_FLAG and the column region identification signal OCT are used.

If a first fail occurs, the first fail is stored in the first row/column address register 110 (step S40). The row/column address register 110 stores the first fail address only 1 time. If a second fail occurs, the address of a fail bit is compared with the row/column addresses stored in the first row/column address register 110 (step S41). The address comparison sections 120 compare all the addresses of fails which occur, in a pattern learning state.

If two addresses are the same, the first row/column multi-bit counter 130 increases its count by 1 (step S42). Conversely, if both the row/column addresses are different, the fail address is stored in the second row/column address register 110 (step S43). The row/column address register 110 stores the second fail address only 1 time.

If a third fail occurs, the address of a fail bit is compared with the row/column addresses stored in the first and second row/column address registers 110 (steps S41 and S44). If there is a case where addresses are the same, the corresponding first or second row/column multi-bit counter 130 increases its count by 1 (steps S42 and S45). Conversely, if the fail address is different from the row/column addresses stored in the first and second row/column address registers 110, the fail address is stored in the third row/column address register 110 (step S46). The row/column address register 110 stores the third fail address only 1 time.

If a fourth fail occurs, the address of a fail bit is compared with the row/column addresses stored in the first, second and third row/column address registers 110 (steps S41, S44 and S47). If there is a case where addresses are the same, a corresponding row/column multi-bit counter 130 increases its count by 1 (steps S42, S45 and S48). Otherwise, fail information is discarded.

Thereafter, in the case of a fifth fail, a sixth fail and so forth additionally occur in the function test as continuously performed, the above operations are repeatedly performed until the function test is ended.

Below, the processes of sequentially selecting the registers 110, analyzing fail modes and performing repair will be described.

First, if the selection signal SEL<0> is enabled, the selection section 150 selects the first row/column address register 110. The selection section 150 also outputs the bank signals BK<0:2>, the fail row addresses RA<1:14>, the fail column addresses CA<3:9>, the row redundancy signal XRED and the column region identification signal OCT. The selection section 140 selects the first multi-bit counter 130, and outputs the row multi-bit signal ROWMBIT and the column multi-bit signal COLMBIT to the fail mode analysis section 180.

The fail mode analysis section 180 combines the row multi-bit signal ROWMBIT, the column multi-bit signal COLMBIT and the row redundancy signal XRED. The fail mode analysis section 180 also outputs the fuse set selection signal XY_SEL to the row/column fuse set register 193 and the data control block 300.

In order to boot up the ARE array 500, the boot-up enable signal BOOTUP_EN is enabled. The oscillation block 200 operates and the clock CLK is enabled. Further, the counter 191 operates and the count signals CNT_BIT<0:M> are enabled.

The fail region search section 192 combines the count signals CNT_BIT<0:M>, the bank signals BK<0:2>, the fail row addresses RA<1:14> and the fail column addresses CA<3:9>. The fail region search section 192 also outputs the row region signal ROW_REGION and the column region signal COL_REGION which represent a fail region, to the row/column fuse set register 193.

The row/column fuse set register 193 combines the row fuse set signals RF_EN and RF_DIS and the column fuse set signals CF_EN and CF_DIS which are applied from the ARE array 500, with the clock CLK, the row region signal ROW_REGION and the column region signal COL_REGION. The row/column fuse set register 193 finds an unused row fuse set in a row fail region and an unused column fuse set in a column fail region. The row/column fuse set register 193 also stores fuse set information in respective corresponding fuse set registers.

Thereafter, if the boot-up operation is ended, the fail mode analysis section 180 selects a fuse set most appropriate in the row/column fuse set register 193 in correspondence to the row fuse nonuse signal RF_OVERFLOW as a result of determining whether there is an unused row fuse set and the column fuse nonuse signal CF_OVERFLOW as a result of determining whether there is an unused column fuse set. The fail mode analysis section 180 corrects the fuse set selection signal XY_SEL. The fail mode analysis section 180 also outputs the corrected fuse set selection signal XY_SEL to the row/column fuse set register 193.

For example, the row fuse nonuse signal RF_OVERFLOW becomes the high level when there is an unused row fuse set, and becomes the low level otherwise. In addition, the column fuse nonuse signal CF_OVERFLOW becomes the high level when there is an unused column fuse set, and becomes the low level otherwise.

Figure 7:
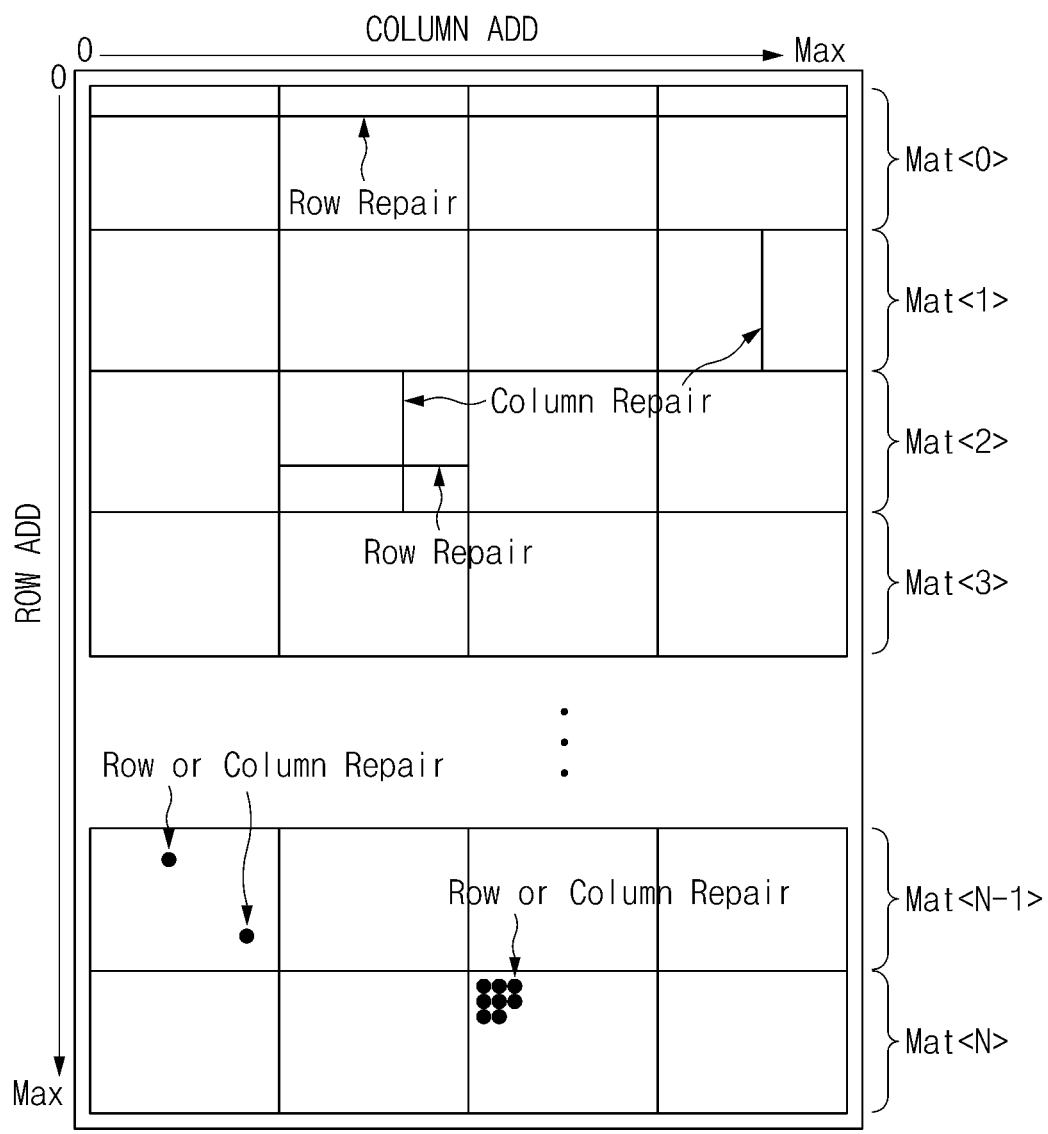
FIG. 7 is a representation of an example of a diagram to assist in a main cell fail repair algorithm in accordance with an embodiment.

Referring to FIG. 7, a representation of an example of a diagram to assist in a main cell fail repair algorithm in accordance with an embodiment is described, wherein ROW ADD, COLUMN ADD, Row Repair, Column Repair and Mat<0:N> are illustrated.

Hereafter, descriptions will be made for the processes of analyzing a fail mode, selecting an appropriate fuse set and performing repair for a selected first fail.

In the case of a single bit fail, the redundancy control signal XY_PRIORITY inputted to the fail mode analysis section 180 becomes the low level (in the case of row priority). Further, both the row multi-bit signal ROWMBIT and the column multi-bit signal COLMBIT become the low levels. When the row fuse nonuse signal RF_OVERFLOW is the high level (there is an unused row fuse set), the fuse set selection signal XY_SEL becomes the low level. However, when the row fuse nonuse signal RF_OVERFLOW is the low level (there is no unused row fuse set), the fuse set selection signal XY_SEL becomes the high level.

Further, in the case of a single bit fail, the redundancy control signal XY_PRIORITY inputted to the fail mode analysis section 180 becomes the high level (in the case of column priority). In addition, both the row multi-bit signal ROWMBIT and the column multi-bit signal COLMBIT become the low levels. When the column fuse nonuse signal CF_OVERFLOW is the high level (there is an unused column fuse set), the fuse set selection signal XY_SEL becomes the high level. However, when the column fuse nonuse signal CF_OVERFLOW is the low level (there is no unused column fuse set), the fuse set selection signal XY_SEL becomes the low level.

In this way, in the case of a single bit fail, repair is performed using a row redundancy or a column redundancy. As in FIG. 7, in the case of a single bit fail, repair is performed with a priority to row repair. In other words, repair is performed using a row redundancy. Further, a column redundancy is used in the case where there is no row redundancy.

In the case of a row-oriented fail, the fail mode analysis section 180 unconditionally outputs the fuse set selection signal XY_SEL at the low level regardless of the logic levels of the redundancy control signal XY_PRIORITY, the row multi-bit signal ROWMBIT and the column multi-bit signal COLMBIT. In this way, in the case of a row-oriented fail, repair is performed using a row redundancy.

Moreover, in the case of a column-oriented fail, the fail mode analysis section 180 unconditionally outputs the fuse set selection signal XY_SEL at the high level regardless of the logic levels of the redundancy control signal XY_PRIORITY, the row multi-bit signal ROWMBIT and the column multi-bit signal COLMBIT. In this way, in the case of a column-oriented fail, repair is performed using a column redundancy.

In the case of a cluster-oriented fail, operations are performed in the same manner as in the case of a single bit fail. If the row redundancy signal XRED is the low level (a row redundancy is used), the fuse set selection signal XY_SEL unconditionally becomes the low level regardless of the logic levels of the redundancy control signal XY_PRIORITY, the row multi-bit signal ROWMBIT and the column multi-bit signal COLMBIT (the metal option). In this way, in the case of a cluster-oriented fail including both a row fail and a column fail, repair is performed using row or column redundancies.

The row/column fuse set register 193 converts selection to a row fuse set or a column fuse set by the fuse set selection signal XY_SEL. The row/column fuse set register 193 also outputs the fuse set signals FS<0:K>. For example, a row fuse set is selected when the fuse set selection signal XY_SEL is the low level. Further, a column fuse set is selected when the fuse set selection signal XY_SEL is the high level.

The row/column fuse set register 193 outputs the fuse nonuse signal OVERFLOW in which the row fuse nonuse signal RF_OVERFLOW and the column fuse nonuse signal CF_OVERFLOW are combined, to the rupture control block 400. For example, if both the row fuse nonuse signal RF_OVERFLOW and the column fuse nonuse signal CF_OVERFLOW are the low levels, the fuse nonuse signal OVERFLOW becomes the low level. If even any one of the row fuse nonuse signal RF_OVERFLOW and the column fuse nonuse signal CF_OVERFLOW is the high level, the fuse nonuse signal OVERFLOW becomes the high level.

If a repair operation is to be performed in the state in which the fuse nonuse signal OVERFLOW is the low level, because there is no unused fuse set in a row fail region and a column fail region, repair is not actually performed.

The data control block 300 combines the fuse set selection signal XY_SEL and the self-rupture signal SELFRUP. The data control block 300 also outputs the bank addresses BANK<0:2>, the addresses ADD<0:N> and the fuse signals FUSE_SET<0:K> to the ARE array 500 by selecting some of the memory repair data MRD<0:M>, the fail row addresses RA<1:14>, the fail column addresses CA<3:9> and the fuse set signals FS<0:K>.

For example, if the self-rupture signal SELFRUP is high and the fuse set selection signal XY_SEL is low, the data control block 300 outputs the bank addresses BANK<0:2>, the addresses ADD<0:N> and the fuse signals FUSE_SET<0:K> to the ARE array 500 by selecting the bank signals BK<0:2>, the fail row addresses RA<1:14> and the fuse set signals FS<0:K>.

Further, if both the self-rupture signal SELFRUP and the fuse set selection signal XY_SEL are high, the data control block 300 outputs the bank addresses BANK<0:2>, the addresses ADD<0:N> and the fuse signals FUSE_SET<0:K> to the ARE array 500 by selecting the bank signals BK<0:2>, the fail row addresses RA<1:14>, the fail column addresses CS<3:9> and the fuse set signals FS<0:K>. The fail row addresses RA<1:14> represent mat information (in the case of repairing columns by the unit of a mat).

Moreover, if the self-rupture signal SELFRUP is low, the data control block 300 outputs the bank addresses BANK<0:2>, the addresses ADD<0:N> and the fuse signals FUSE_SET<0:K> to the ARE array 500 by selecting the memory repair data MRD<0:M> regardless of the fuse set selection signal XY_SEL. The case of selecting the memory repair data MRD<0:M> represents the case of performing repair in a normal repair mode on a wafer by receiving repair information from an exterior.

Next, as the rupture enable signal RUPTURE_EN is enabled to perform repair, the rupture control block 400 combines the clock CLK and the fuse nonuse signal OVERFLOW. The rupture control block 400 also outputs the rupture control signals RUP_CTRL<0:S> to the ARE array 500. Then, as the ARE array 500 finds a corresponding fuse set based on the bank addresses BANK<0:2>, the addresses ADD<0:N> and the fuse signals FUSE_SET<0:K> transmitted and selects fuses corresponding to the bits of the addresses ADD<0:N> one by one, the repair operation is performed.

Next, descriptions will be made for the processes of analyzing the mode of the fail stored in the second row/column address register 110 and performing repair.

If the selection signal SEL<1> is enabled, the selection section 150 selects the second row/column address register 110. The selection section 150 also outputs the bank signals BK<0:2>, the fail row addresses RA<1:14>, the fail column addresses CA<3:9>, the row redundancy signal XRED and the column region identification signal OCT. The selection section 140 selects the second multi-bit counter 130. The selection section 140 also outputs the row multi-bit signal ROWMBIT and the column multi-bit signal COLMBIT to the fail mode analysis section 180. Thereafter, the analyzing process of the fail mode analysis section 180 and the repair process described above are performed repeatedly.

Finally, descriptions will be made for the processes of analyzing the mode of the fail stored in the third row/column address register 110 and performing repair.

If the selection signal SEL<2> is enabled, the selection section 150 selects the third row/column address register 110. The selection section 150 also outputs the bank signals BK<0:2>, the fail row addresses RA<1:14>, the fail column addresses CA<3:9>, the row redundancy signal XRED and the column region identification signal OCT. The selection section 140 selects the third multi-bit counter 130. The selection section 140 also outputs the row multi-bit signal ROWMBIT and the column multi-bit signal COLMBIT to the fail mode analysis section 180. Thereafter, the analyzing process of the fail mode analysis section 180 and the repair process described above are performed repeatedly.

Figure 8:
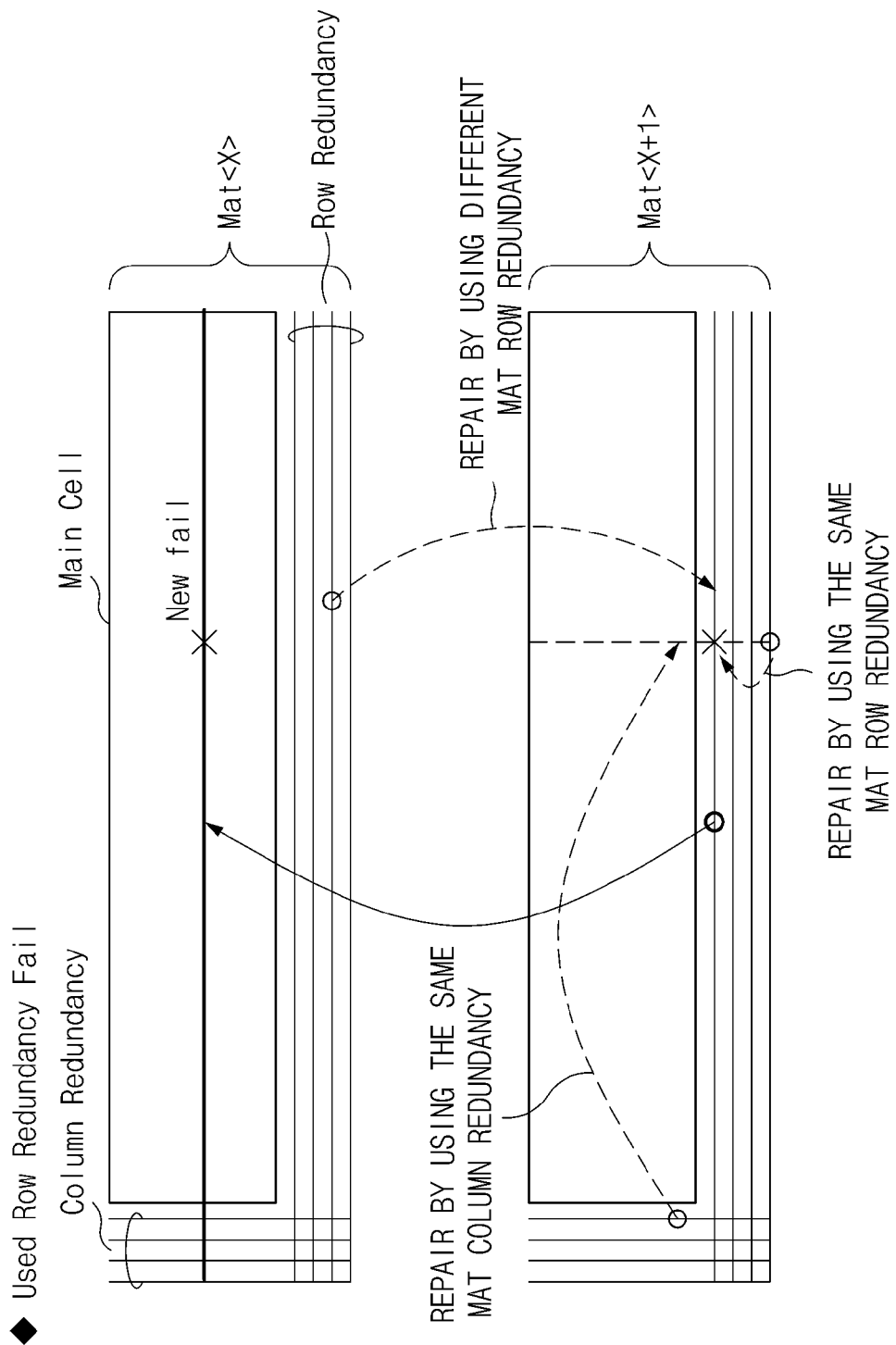
FIGS. 8 and 9 are representations of examples of diagrams to assist in a row/column redundancy fail repair algorithm in accordance with an embodiment.
Figure 9:
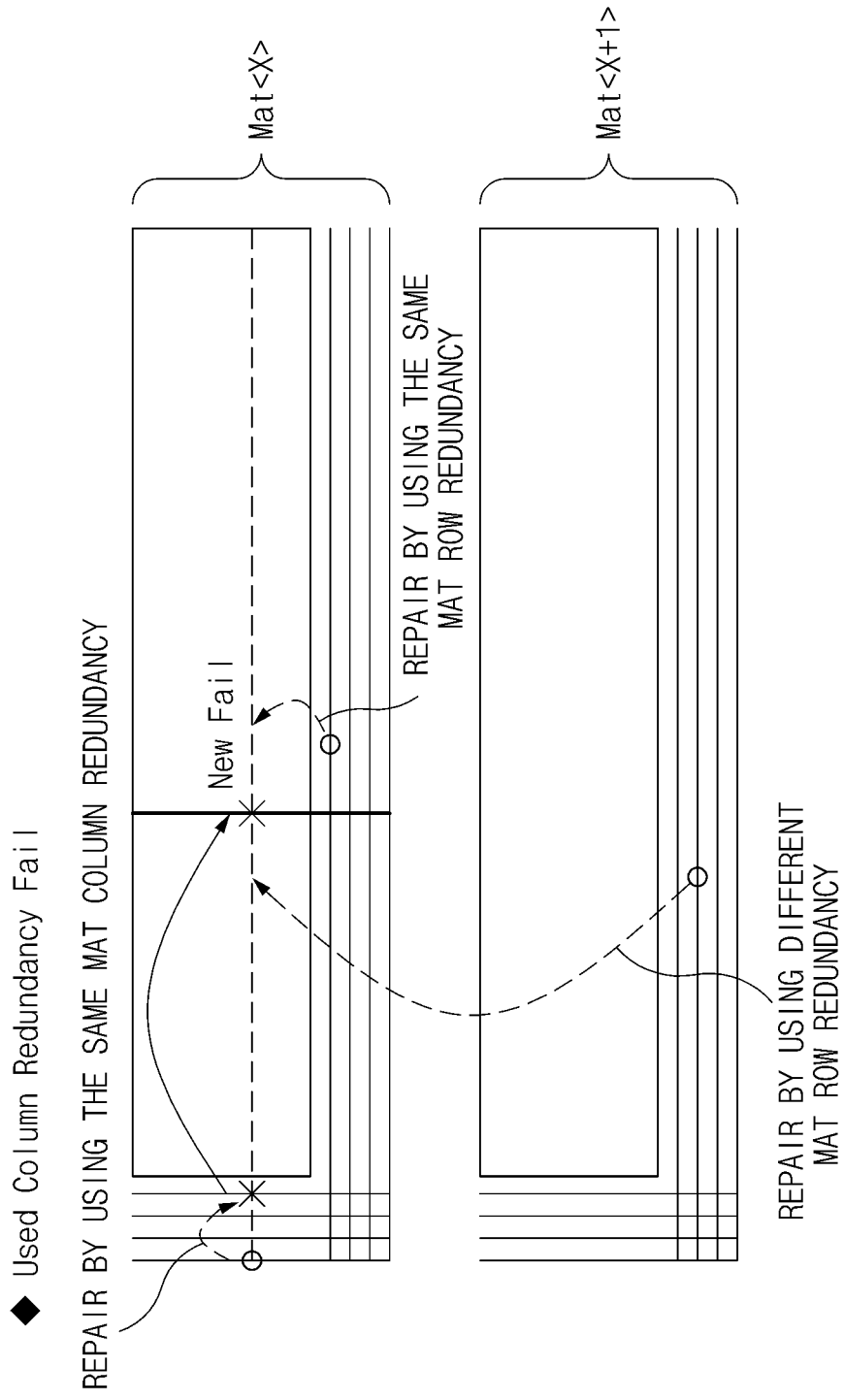

Referring to FIGS. 8 and 9, representations of examples of diagrams to assist in a row/column redundancy fail repair algorithm in accordance with an embodiment are described. FIGS. 8 and 9 illustrate, a New fail, with Mats <X> and <X+1>.

FIG. 8 shows a method for performing repair when an already used row redundancy is failed. Further, FIG. 9 shows a method for performing repair when an already used column redundancy is failed.

In the case of a row-oriented fail as shown in FIG. 8, it is possible to perform row repair by using an unused row redundancy which exists in the same mat or a different mat. In the case of a single bit fail, even though a row redundancy of a different mat is used, column repair is also possible because mat information is automatically changed by the row redundancy signal XRED. When a row redundancy of a different mat is used, a mat is changed in an active operation. However, because the information of the changed mat is stored by the row redundancy signal XRED when capturing a fail, it is possible to perform repair, by using a column in the changed mat. Accordingly, column repair is possible regardless of the use of a row redundancy in the same mat or a different mat. Row or column repair may be performed for a used row redundancy fail.

In the case of a column-oriented fail as in FIG. 9, it is possible to perform column repair by using an unused column redundancy which exists in the same mat. In the case of a single bit fail, row repair may be performed by using a row redundancy which exists in the same mat or a different mat. Row or column repair may be performed for a used column redundancy fail.

As is apparent from the above descriptions, in an embodiment, since it is possible to repair various modes of fails, the package yield may be improved. In an embodiment, repair may be performed by optionally selecting a row redundancy or a column redundancy.

In addition, where there is no unused row redundancy, a method for making a conversion to a column redundancy may be modified. That is to say, in an embodiment, a method is used, in which both a row fuse set register and a column fuse set register are provided. Further, in order to simultaneously secure an unused row fuse set and an unused column fuse set, the boot-up operation of the ARE array 500 is performed 1 time; the row fuse nonuse signal RF_OVERFLOW and the column fuse nonuse signal CF_OVERFLOW are inspected; and the fuse set selection signal XY_SEL is changed immediately to the high level when the row fuse nonuse signal RF_OVERFLOW is the low level. In a method, a fuse set register is provided for common use in a row and a column. Further, an operation of finding an unused row fuse set is performed by performing boot-up. Thereafter, by inspecting the row fuse nonuse signal RF_OVERFLOW, if the row fuse nonuse signal RF_OVERFLOW is the low level, the fuse set selection signal XY_SEL is inverted to the high level. In addition, the ARE array 500 is booted up to fine an unused column fuse set (boot-up is needed two times). Further, in a method for performing repair after completing fail capture and fail mode analysis, signals associated with repair may be controlled by inputting a clock from an exterior.

Figure 10:
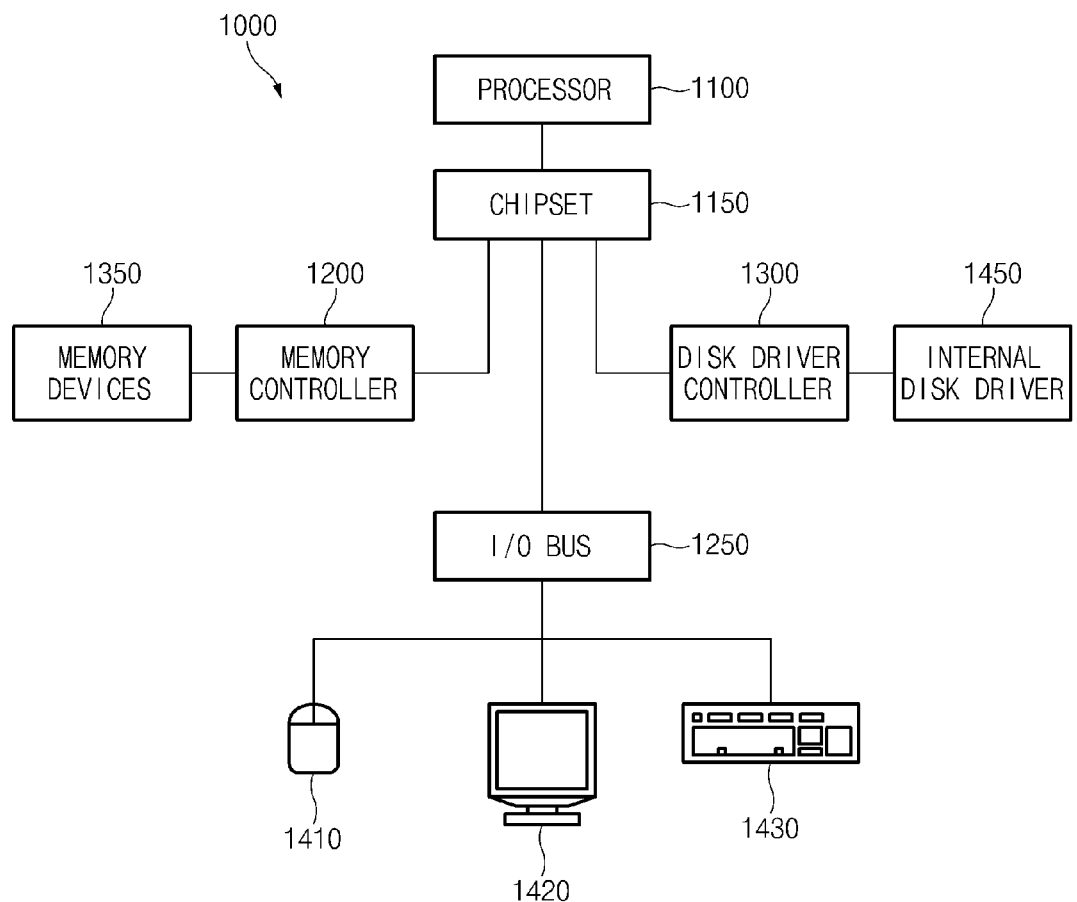
FIG. 10 illustrates a block diagram of a system employing a memory controller circuit in accordance with an embodiment of the invention.

Referring to FIG. 10, a block diagram of a system 1000 in accordance with the various embodiments is illustrated and generally designated by a reference numeral 1000. The system 1000 may include one or more processors (i.e. Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e, CPUs) may be implemented.

A chipset 1150 may be operably coupled to the processor (i.e, CPU) 1100. The chipset 1150 is a communication pathway signals between the processor (i.e., CPU) 1100 and other components of the system 1000. Other components of the system 1000 may include a memory controller 1200, an input/output ("I/O") bus 1250, and disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 can receive a request provided from the processor (i.e., CPU) 1100, through the chipset 1150. The memory controller 1200 may be operably coupled to one or more memory devices 1350. In an embodiment, the memory devices 1350 may include smart self-repair device described above.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include, for example but are not limited to, a mouse 1410, a video display 1420, or a keyboard 1430. The I/O bus 1250 may employ any one of a number of communications protocols to communicate with the I/O devices 1410, 1420 and 1430.

The disk driver controller 1300 may be operably coupled to the chipset 1150. The disk driver controller 1300 may serve as the communication pathway between the chipset 1150 and one internal disk driver 1450 or more than one internal disk driver 1450. The disk driver controller 1300 and the internal disk driver 1450 may communicate with each other with the chipset 1150 using virtually any type of communication protocol, including, all of those mentioned above with regard to the I/O bus 1250.

In various embodiments, since repair may be optimally performed by automatically selecting row or column redundancies according to various fail modes occurring in a package, it is possible to contribute to improvement of a package yield and shorten a yield ramp-up time.

While various embodiments have been described above, it will be understood to those skilled in the art that the embodiments described are by way of examples only. Accordingly, the smart self-repair device and method described should not be limited based on the described embodiments above.

What is claimed is:

1. A smart self-repair device comprising:
an array rupture electrical fuse (ARE) array configured to store information on respective bits of a fail address in fuses;
a self-repair control block configured to store a row address and a column address corresponding to a fail bit when a fail occurs, analyze a fail mode by comparing the fail address inputted in a test and the stored addresses, and output fail address information and row fuse set information or column fuse set information according to the fail mode;
a data control block configured to output repair information to the ARE array according to the fail address information and the row fuse set information or the column fuse set information; and
a rupture control block configured to control a rupture operation of the ARE array,
wherein the self-repair control block comprises:
a repair selection unit configured to store the row address and the column address corresponding to the fail bit, and analyze the fail mode by comparing the fail address inputted in the test and the stored addresses; and
a fuse set selection unit configured to output the fail address information and the row fuse set information or the column fuse set information in correspondence to the fail mode.

2. The smart self-repair device according to claim 1, further comprising:
an oscillation block configured to output a clock to the self-repair control block according to a boot-up enable signal and a rupture enable signal.

3. The smart self-repair device according to claim 1, wherein the repair selection unit comprises:

row/column address registers configured to sequentially store row addresses and column addresses corresponding to a plurality of different fail bits when the fail occurs;

address comparison sections configured to compare the fail address of a fail cell which is additionally inputted in the test, with the addresses stored in the row/column address registers;

multi-bit counters configured to count outputs of the address comparison sections; and a fail mode analysis section configured to analyze one or more fail modes of fail addresses stored in the row/column address registers in correspondence to outputs of the multi-bit counters when the test is ended, and output a fuse set selection signal.

4. The smart self-repair device according to claim 3, wherein, where a row redundancy signal is a low level, the fail mode analysis section determines that a fail has occurred in a cell in which a row redundancy is used, and, where the row redundancy signal is a high level, the fail mode analysis section determines that a fail has occurred in a main cell.

5. The smart self-repair device according to claim 3, wherein the fail mode analysis section receives the outputs of the multi-bit counters, a row redundancy signal, a redundancy control signal, a row redundancy selection signal, a column redundancy selection signal and row/column fuse nonuse signals, and outputs the fuse set selection signal for performing repair using a row redundancy or a column redundancy, to the data control block.

6. The smart self-repair device according to claim 3, wherein the fail mode analysis section receives the outputs of the multi-bit counters, a row redundancy signal, a redundancy control signal, a row redundancy selection signal, a column redundancy selection signal and row/column fuse nonuse signals, and determines whether it is a single bit fail, a column-oriented fail, a row-oriented fail or a cluster-oriented fail.

7. The smart self-repair device according to claim 3, wherein the fail mode analysis section comprises:
a selection signal generation part configured to perform a logic function on a row multi-bit signal and a column multi-bit signal applied from the multi-bit counters, a priority signal, a row redundancy signal, a row redundancy selection signal and a column redundancy selection signal, and output the fuse set selection signal; and
a control signal generation part configured to perform an other logic function on the row multi-bit signal, the column multi-bit signal, a row fuse nonuse signal, a column fuse nonuse signal and a redundancy control signal, and generate the priority signal.

8. The smart self-repair device according to claim 7, wherein, where both the row multi-bit signal and the column multi-bit signal are high levels, the fail mode analysis section determines that both a row-oriented fail and a column-oriented fail have occurred and outputs the fuse set selection signal at a low level, and, where at least any one of the row multi-bit signal and the column multi-bit signal is the low level, the fail mode analysis section changes the fuse set selection signal.

9. The smart self-repair device according to claim 3, wherein the row/column address registers receive bank addresses, a row address and a column address of a failed memory cell, a row repair flag signal and a column region identification signal, and sequentially store the row address and the column address in a plurality of registers in correspondence to storage signals.

10. The smart self-repair device according to claim 3, wherein the multi-bit counters increase count values where comparison results of the address comparison sections are equivalent.

11. The smart self-repair device according to claim 3, wherein the multi-bit counters change count values which serve as references for a row-oriented fail or a column-oriented fail.

12. The smart self-repair device according to claim 1, wherein the repair selection unit further comprises:
a first selection section configured to select any one of outputs of row/column address registers in correspondence to selection signals; and
a second selection section configured to select any one of the outputs of multi-bit counters in correspondence to the selection signals, and output it to a fail mode analysis section.

13. The smart self-repair device according to claim 12, wherein the first selection section selects any one of the outputs of the row/column address registers, and outputs a row redundancy signal which represents whether a fail bit uses a row redundancy or not, to the fail mode analysis section.

14. The smart self-repair device according to claim 1, wherein the fuse set selection unit comprises:
a fail region search section configured to search a row address fail region and a column address fail region in correspondence to an output of a first selection section; and
a row/column fuse set register configured to store information on unused fuse sets, and output the information to a fail mode analysis section and the rupture control block.

15. The smart self-repair device according to claim 14, wherein the fuse set selection unit further comprises:
a counter configured to count a clock, and output counting signals to the fail region search section, a row/column fuse set register, the rupture control block and the ARE array.

16. The smart self-repair device according to claim 14, wherein a row/column fuse set register receives a row region signal and a column region signal which are applied from the fail region search section, a clock, row fuse set signals and column fuse set signals which are applied from the ARE array, and a fuse set selection signal, outputs a row fuse nonuse signal and a column fuse nonuse signal to a fail mode analysis section, outputs fuse set signals to the data control block, and outputs a fuse nonuse signal to the rupture control block.

17. The smart self-repair device according to claim 1, wherein, in correspondence to outputs of the self-repair control block, the ARE array repairs a row-oriented fail by using a row redundancy, repairs a column-oriented fail by using a column redundancy, and repairs a fail other than the row/column-oriented fail by selecting a row redundancy or a column redundancy in which a fuse set is left.

18. A smart self-repair method comprising:
storing a row address and a column address corresponding to a fail bit in a register;
analyzing a fail mode by comparing a fail address inputted in a test and the addresses stored in the register and by combining logic levels of a row multi-bit signal and a column multi-bit signal;
searching unused fuse set information according to fuse information applied from an array rupture electrical fuse (ARE) array in a boot-up operation; and receiving fail address information corresponding to the first fail bit and the fuse set information, and performing a row repair operation or a column repair operation corresponding to the fail mode.

19. The smart self-repair method according to claim 18, further comprising:
repeatedly performing processes for random fail bits inputted after the fail bit.

20. The smart self-repair method according to claim 18, further comprising:
performing row repair by using an unused row redundancy which exists in a same mat or a different mat, in a case where a determination is made as a row-oriented fail as a result of analyzing the fail mode.

21. The smart self-repair method according to claim 18, further comprising:
performing repair by using a column redundancy of a corresponding mat, when a row redundancy which exists in a same mat or a different mat is used in a case where a determination is made as a single bit fail as a result of analyzing the fail mode.

22. The smart self-repair method according to claim 18, further comprising:
performing repair by using a row redundancy which exists in a same mat or a different mat, when a column redundancy is used in a case where a determination is made as a single bit fail as a result of analyzing the fail mode.

23. The smart self-repair method according to claim 18, further comprising:
performing column repair by using an unused column redundancy which exists in a same mat, in a case where a determination is made as a column-oriented fail as a result of analyzing the fail mode.

24. A smart self-repair device comprising:
a self-repair control block configured to output bank signals, fail row addresses, fail column addresses, fuse set signals, and a fuse set selection signal;
a data control block configured to receive the bank signals, the fail row addresses, the fail column addresses, the fuse set signals, the fuse set selection signal, memory repair data, and a self-rupture signal and output bank addresses, addresses, and fuse signals; and
an array rupture electrical fuse (ARE) array configured to perform a rupture operation according to the bank addresses, the addresses and the fuse signals,
wherein the self-repair control block analyzes a fail mode according to logic levels of a row multi-bit signal and a column multi-bit signal.

25. The smart self-repair device according to claim 24, further comprising:
a rupture control block configured to control the rupture operation of the ARE array according to a fuse nonuse signal, a clock, and a rupture enable signal.

26. The smart self-repair device according to claim 25, wherein the rupture enable signal is a signal used when performing a repair operation.

27. The smart self-repair device according to claim 24, wherein the ARE array stores address information of a failed cell when rupture control signals are enabled.

28. The smart self-repair device according to claim 24, wherein when one or more fails occur during a test, the self-repair control block is configured to store row/column addresses of random bits in order in which the one or more fails occur.

29. The smart self-repair device according to claim 24, wherein if a row redundancy signal is at a low level, a fail has occurred in a cell in which a row redundancy was used, and if the row redundancy is at a high level, a fail has occurred in a main cell.

30. The smart self-repair device according to claim 24, wherein the self-repair control block searches a row address fail region and a column address fail region when the ARE array is booted up.

31. The smart self-repair device according to claim 24, wherein the self-repair control block analyzes a fail mode of a fail bit, wherein the fail mode of a fail bit can include a single bit fail, a row-oriented fail, a column-oriented fail, and a cluster-oriented fail.

32. The smart self-repair device according to claim 24, wherein the self-repair control block outputs the fuse set selection signal, wherein the fuse set selection signal is a signal which selects a fuse set and an address to perform repair by selecting a row redundancy or a column redundancy.

33. The smart self-repair device according to claim 24, wherein the logic levels of the row multi-bit signal and the column multi-bit signal determine a column-oriented fail or a row-oriented fail.

* * * * *